United States Patent
Hsu

(10) Patent No.: US 8,188,379 B2
(45) Date of Patent: May 29, 2012

(54) PACKAGE SUBSTRATE STRUCTURE

(75) Inventor: Shin-Ping Hsu, Hsin-Chu (TW)

(73) Assignee: Unimicron Technology Corp., Taoyuan (TW)

( * ) Notice: Subject to any disclaimer, the term of this patent is extended or adjusted under 35 U.S.C. 154(b) by 361 days.

(21) Appl. No.: 12/495,191

(22) Filed: Jun. 30, 2009

(65) Prior Publication Data

US 2010/0002405 A1  Jan. 7, 2010

(30) Foreign Application Priority Data

Jul. 4, 2008 (TW) .............................. 97125162 A
Jul. 11, 2008 (TW) .............................. 97126240 A

(51) Int. Cl.
*H05K 1/11* (2006.01)

(52) U.S. Cl. ........ 174/262; 174/261; 174/252; 174/265; 361/761; 361/768

(58) Field of Classification Search .......... 361/760–762, 361/767, 768, 783, 790, 792; 174/260–265, 174/252, 255, 521, 526

See application file for complete search history.

(56) References Cited

U.S. PATENT DOCUMENTS

| | | | | |
|---|---|---|---|---|
| 5,814,883 A * | 9/1998 | Sawai et al. | .................... | 257/712 |
| 6,005,289 A * | 12/1999 | Watanabe et al. | ............. | 257/700 |
| 6,037,656 A * | 3/2000 | Sugahara | ....................... | 257/697 |
| 6,790,710 B2 * | 9/2004 | McLellan et al. | ............. | 438/122 |
| 7,476,811 B2 * | 1/2009 | Kubota et al. | .................. | 174/250 |
| 7,525,813 B2 * | 4/2009 | Kohjiro et al. | ................ | 361/760 |
| 2006/0237225 A1 * | 10/2006 | Kariya et al. | .................. | 174/260 |
| 2009/0115050 A1 * | 5/2009 | Kasuya et al. | ................ | 257/701 |

\* cited by examiner

*Primary Examiner* — Hoa C Nguyen

(74) *Attorney, Agent, or Firm* — Peter F. Corless; Steven M. Jensen; Edwards Wildman Palmer LLP

(57) ABSTRACT

A package substrate structure includes: a substrate having a first surface and an opposing second surface and characterized by a plurality of wire-bonding pads provided on the first surface of the substrate, a plurality of ball-implanting pads provided on the second surface of the substrate, and at least a cavity formed to penetrate the first and second surfaces of the substrate; a metal board mounted on the second surface of the substrate and covering the cavity, wherein the metal board has a thickness greater than that of the ball-implanting pads and has an area greater than that of the cavity; and solder masks disposed on the first and second surfaces of the substrate respectively and having at least a solder-mask cavity corresponding in position to the cavity of the substrate, the solder masks further having a plurality of openings for exposing the wire-bonding pads, the ball-implanting pads and the metal board.

18 Claims, 4 Drawing Sheets

PACKAGE SUBSTRATE STRUCTURE

FIELD OF THE INVENTION

The present invention generally relates to package substrate structures, and more particularly, to a package substrate structure with at least a semiconductor component embedded therein.

BACKGROUND OF THE INVENTION

Stacking of semiconductor chips is a desirable technology for its capability of meeting the requirements in high integration and miniaturization of semiconductor packages and enhancing the ability and capacity of a single semiconductor package so as for the semiconductor package to be suitable for use in low-profile, large-capacity and high-speed electronic devices.

Referring to FIG. 1A, a conventional chip-stacking semiconductor package includes: a first semiconductor chip 11 mounted on and electrically connected to a side of a substrate 10 in a flip-chip manner; a plurality of solder balls 12 implanted to a side of the substrate 10 opposing to the side mounted with the first semiconductor chip 11 and configured to be electrically connected to an external electronic device; at least a second semiconductor chip 13 attached to the first semiconductor chip 11 and electrically connected to the substrate 10 by bonding wires 14; and an encapsulant 15 formed on the substrate 10 and encapsulating the first and second semiconductor chips 11, 13.

However, a cost issue has been raised for the above chip-stacking semiconductor package because the first and second semiconductor chips 11, 13 are electrically connected to the same said substrate 10. In such case, if one of the semiconductor chips is defective, the semiconductor package as a whole would fail. And, it only allows the yield test to be conducted on both the semiconductor chips as a whole instead of each single semiconductor chip, such that once a defect is found, the semiconductor package as a whole must be discarded. This is not cost-effective.

Referring to FIG 1B, to solve the above cost issue, another conventional semiconductor package has been developed by Package on Package (POP) technology, which comprises at least two packages 16 that are stacked and electrically connected to each other by conductive elements 17. Each of the packages 16 includes a substrate 160, a semiconductor chip 161 mounted on and electrically connected to the substrate 160 in a wire-bonded manner, and an encapsulant 162 formed on a portion of the substrate 160 and encapsulating the semiconductor chip 161. The conductive elements 17 are mounted on the substrates 160. Moreover, a plurality of solder balls 163 are implanted to a side of the substrate 160 of the underlying/lowermost package 16 as opposed to the other stack-disposed side of the substrate 160 and configured to be electrically connected to an external electronic device.

However, the POP semiconductor package has a limit in size. The height of each of the packages 16 is the sum of heights of the substrate 160 and the encapsulant 162 that encapsulates the semiconductor chip 161. With the semiconductor chip 161 being mounted on the substrate 160, the height of the encapsulant 162 must be increased. In such case, the overall height of the semiconductor package would easily exceed the expected range, and the POP semiconductor package thus fabricated is hardly compact, leading to its limited applicability in electronic devices. Another issue is overheating. With the semiconductor chip 161 being encapsulated by the encapsulant 162, heat generated by the semiconductor chip 161 in operation is accumulated rather than efficiently dissipated, and in consequence the semiconductor chip 161 is likely to be overheated and damaged.

Therefore, it is important and urgent to solve the above problems encountered in the conventional semiconductor packages.

SUMMARY OF THE INVENTION

In view of the aforementioned drawbacks, an objective of the present invention is to provide a package substrate structure capable of reducing the package height.

Another objective of the present invention is to provide a package substrate structure having a heat dissipating function.

In accordance with the above and other objectives, the present invention proposes a package substrate structure, comprising: a substrate having a first surface and an opposing second surface, wherein a plurality of wire-bonding pads are formed on the first surface of the substrate, a plurality of ball-implanting pads are formed on the second surface of the substrate, and at least a cavity is formed through the first and second surfaces of the substrate; a metal board mounted on the second surface of the substrate and covering the cavity, wherein the metal board has a thickness greater than that of each of the ball-implanting pads and has an area greater than that of the cavity; and solder masks disposed on the first and second surfaces of the substrate respectively and having at least a solder-mask cavity corresponding in position to the cavity of the substrate, the solder masks further having a plurality of openings corresponding in position to and exposing the wire-bonding pads, the ball-implanting pads and the metal board.

In the above package substrate structure, the substrate is a two-layered or multi-layered package substrate completed with the predetermined circuit layout. The metal board is made of copper. A plurality of solder balls can be formed in the openings of the solder mask on the second surface of the substrate and are in contact with the metal board or the ball-implanting pads. The wire-bonding pads are coplanar with the first surface of the substrate, and the ball-implanting pads are coplanar with the second surface of the substrate.

The above package substrate structure may further comprise conductive pads, at least a semiconductor chip, bonding wires or an encapsulant. The conductive pads can be provided on the first surface of the substrate, for being coupled to conductive elements so as to allow the substrate to be electrically connected to a semiconductor package. The semiconductor chip is received in the cavity of the substrate and attached to the metal board. The semiconductor chip comprises an active surface and an opposing inactive surface, wherein a plurality of electrode pads are formed on the active surface, and the metal board is coupled to the semiconductor chip via the inactive surface thereof. The bonding wires electrically connect the electrode pads of the semiconductor chip to the wire-bonding pads of the substrate. The encapsulant can be formed on the first surface of the substrate and fill the cavity of the substrate, so as to encapsulate the semiconductor chip, the bonding wires and the wire-bonding pads.

The above package substrate structure may further comprise a surface treatment layer provided on the wire-bonding pads.

In another embodiment, the package substrate structure may further comprise a dielectric layer disposed between the second surface of the substrate and the solder mask, wherein the cavity of the substrate is extended to the dielectric layer to thereby penetrate the dielectric layer, and the metal board is at least partly embedded in the dielectric layer or is provided on the dielectric layer. Similarly, the package substrate structure may further comprise a semiconductor chip received in the cavity of the substrate and attached to the metal board. The semiconductor chip comprises an active surface and an opposing inactive surface, wherein a plurality of electrode pads are formed on the active surface, and the metal board is coupled to the semiconductor chip via the inactive surface thereof. The wire-bonding pads of the substrate are electrically connected to the electrode pads of the semiconductor chip by bonding wires.

In a further embodiment, the package substrate structure may further comprise a dielectric layer disposed between the second surface of the substrate and the solder mask. The cavity of the substrate does not penetrate the dielectric layer, and the dielectric layer covers the cavity of the substrate, such that the dielectric layer is positioned between the cavity of the substrate and the metal board, and the metal board is provided on the dielectric layer or embedded in the dielectric layer. The package substrate structure may further comprise a semiconductor chip received in the cavity of the substrate and attached to the dielectric layer. The semiconductor chip comprises an active surface and an opposing inactive surface, wherein a plurality of electrode pads are formed on the active surface, and the dielectric layer is coupled to the semiconductor chip via the inactive surface thereof. The wire-bonding pads of the substrate are electrically connected to the electrode pads of the semiconductor chip by bonding wires.

The package substrate structure of the present invention uses the cavity of the substrate to accommodate the semiconductor chip, thereby reducing the overall package height. With the metal board being thicker than the ball-implanting pads, the semiconductor chip can be firmly attached to the metal board. Further, with the good thermal conductivity of the metal board, heat generated by the semiconductor chip can be dissipated through the metal board, thereby providing desirable heat dissipating performance.

DETAILED DESCRIPTION OF THE PREFERRED EMBODIMENTS

Preferred embodiments of a package substrate structure, its combination with a semiconductor chip and a package stacking application as proposed in the present invention are described below by reference to FIGS. 2A through 2E and FIG. 3. It should be understood that the drawings are schematic diagrams only showing relevant components in the present invention, and the practical component layout could be more complicated.

Figure 1A:
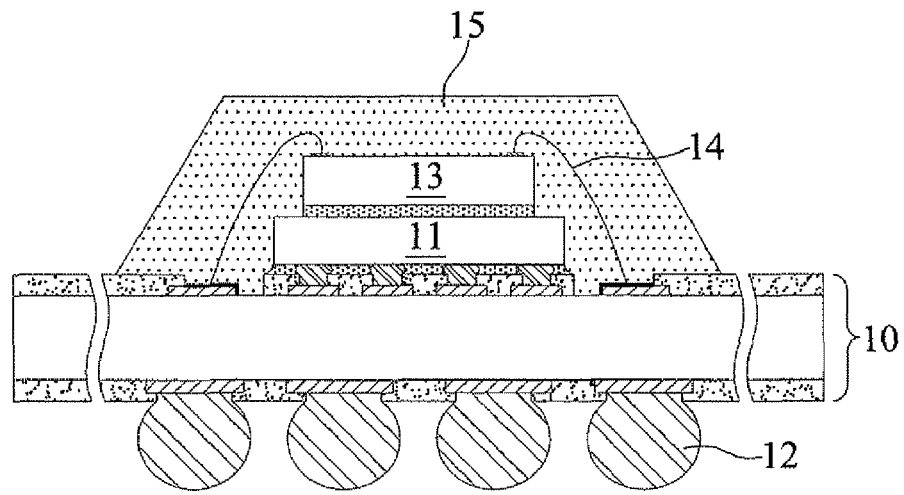
FIGS. 1A and 1B (PRIOR ART) are cross-sectional schematic diagrams of conventional semiconductor packages.
Figure 1B:
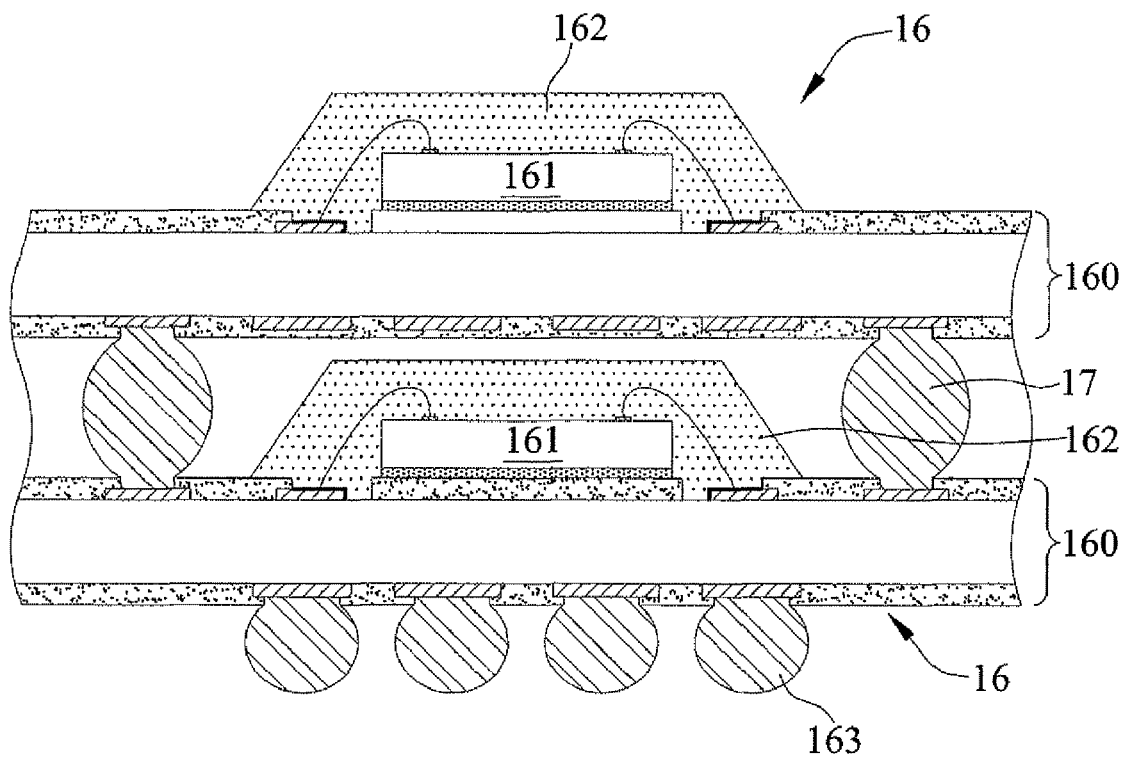
Figure 2A:
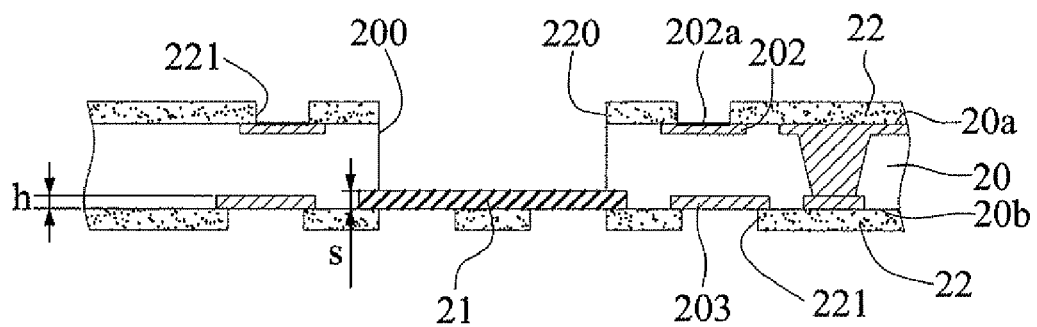
FIGS. 2A to 2E are cross-sectional schematic diagrams showing a package substrate structure of the present invention packaged with a semiconductor chip.

FIG. 2A is a cross-sectional schematic diagram of a package substrate structure in accordance with the present invention. As shown in FIG. 2A, the package substrate structure comprises a substrate 20, a metal board 21 and solder masks 22.

The substrate 20 is a two-layered or multi-layered package substrate completed with a predetermined circuit layout, wherein the circuit layers within the substrate or on surfaces of the substrate are electrically connected to each other by conductive vias or plated through holes. A plurality of wire-bonding pads 202 are formed on a first surface 20a of the substrate 20, and a plurality of ball-implanting pads 203 are formed on a second surface 20b of the substrate 20. A cavity 200 is formed in the substrate 20 to penetrate the first and second surfaces 20a, 20b of the substrate 20.

The metal board 21 is made of copper (Cu) and is disposed on the second surface 20b of the substrate 20. The metal board 21 is coplanar with the second surface 20b of the substrate 20 and covers one end of the cavity 200. The thickness of the metal board 21 is greater than that of each of the ball-implanting pads 203, and the area of the metal board 21 is slightly larger than that of the cavity 200, for allowing the metal board 21 to serve as a carrier for a semiconductor chip.

The solder masks 22 are disposed on the first and second surfaces 20a, 20b of the substrate 20, respectively. Each of the solder masks 22 has a solder-mask cavity 220 corresponding in position to the cavity 200 of the substrate 20, and has a plurality of openings 221 corresponding in position to and exposing the wire-bonding pads 202, the metal board 21, and the ball-implanting pads 203, respectively.

In this embodiment, the wire-bonding pads 202 at the first surface 20a of the substrate 20 are made flush with the first surface 20a, and the ball-implanting pads 203 at the second surface 20b of the substrate 20 are made flush with the second surface 20b.

A surface treatment layer 202a can be deposited on the wire-bonding pads 202 by electroplating or chemical deposition, for enhancing the electrical connection performance. The surface treatment layer 202a is made of at least a material selected from the group consisting of nickel (Ni), palladium (Pd), gold (Au), and tin (Sn), for example, chemically deposited Ni/Au (forming nickel first and then forming gold), Electroless Nickel and Immersion Gold (ENIG), electroplated Ni/Au, Electroless Nickel/Electroless Palladium/Immersion Gold (ENEPIG), Immersion Tin (IT), Direct Immersion Gold (DIG), or Electroless Nickel Autocatalytic Gold (ENAG).

Figure 2B:
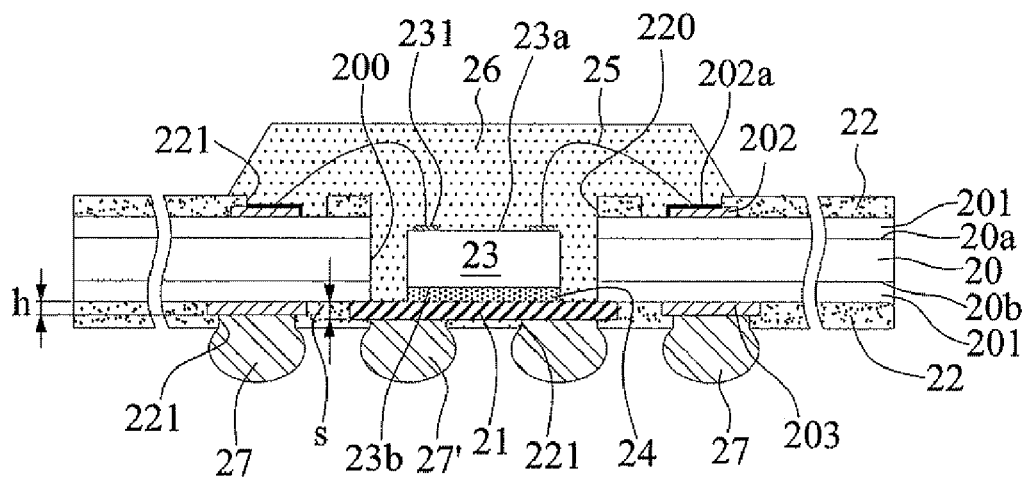
Figure 2C:
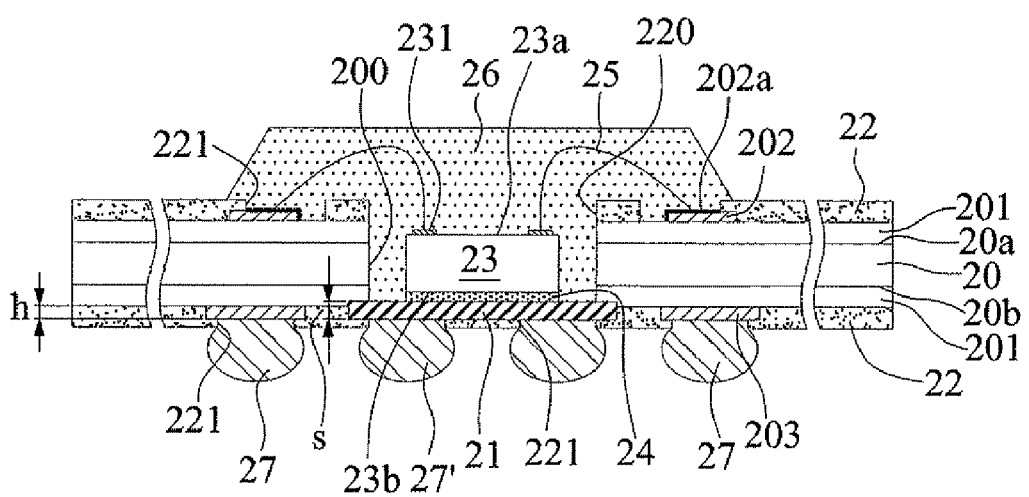

FIGS. 2B and 2C are cross-sectional schematic diagrams showing a package substrate structure of one embodiment of the present invention packaged with a semiconductor chip. In this embodiment, the package substrate structure further comprises a semiconductor chip 23, bonding wires 25 and an encapsulant 26, in addition to those components shown in FIG. 2A.

Referring to FIGS. 2B and 2C, a dielectric layer 201 is further formed on each of the first and second surfaces 20a, 20b of the substrate 20. Particularly, there is a dielectric layer 201 disposed between the second surface 20b of the substrate 20 and the solder mask 22.

Moreover, the cavity 200 is formed to penetrate the substrate 20 and the dielectric layers 201. As shown in FIG. 2B, the metal board 21 is disposed on the dielectric layer 201 on the second surface 20b of the substrate 20. Referring to FIG. 2C, alternatively, the edge of the metal board 21 is embedded, in whole or in part (as shown in FIG. 2C), in the dielectric layer 201.

The semiconductor chip 23 has an active surface 23a and an opposing inactive surface 23b. A plurality of electrode pads 231 are formed on the active surface 23a of the semiconductor chip 23. The semiconductor chip 23 is fixed, via the inactive surface 23b thereof, in position to the metal board 21 exposed from the cavity 200 of the substrate 20, using an adhesive layer 24. The electrode pads 231 of the semiconductor chip 23 are electrically connected to the wire-bonding pads 202 of the substrate 20 by the bonding wires 25.

The thickness s of the metal board 21 is greater than the thickness h of each of the ball-implanting pads 203, and the area of the metal board 21 is slightly larger than that of the cavity 200 of the substrate 20, so as to allow the metal board 21 to carry the semiconductor chip 23. With the thickness s of the metal board 21 being greater than the thickness h of the ball-implanting pads 203, the semiconductor chip 23 is firmly mounted on the metal board 21. Also, owing to high thermal conductivity of the metal board 21, heat generated by the semiconductor chip 23 is dissipated through the metal board 21.

The encapsulant 26 is provided on the dielectric layer 201 on the first surface 20a of the substrate 20 and fills the cavity 200 of the substrate 20, so as to encapsulate the semiconductor chip 23, the bonding wires 25 and the wire-bonding pads 202.

Furthermore, the ball-implanting pads 203 and the metal board 21 exposed from the openings 221 of the solder mask 22 on the second surface 20b of the substrate 20 are mounted with a plurality of solder balls 27, 27', respectively, such that a package is formed. The solder balls 27' attached to the metal board 21 are configured for heat dissipation, and the solder balls 27 implanted to the ball-implanting pads 203 are configured to be connected to an external electronic device, such as a printed circuit board.

In the present invention, the semiconductor chip 23 is received in the cavity 200 of the substrate 20, thereby reducing the overall package height. Compared to the conventional technology, the encapsulant 26 of the semiconductor package structure in the present invention need not to be sized in accordance with the height of the semiconductor chip 23, thereby reducing the overall package height greatly. Further, with the semiconductor chip 23 being received in the cavity 200 and carried by the metal board 21, heat generated by the semiconductor chip 23 in operation dissipates through the metal board 21.

Figure 2D:
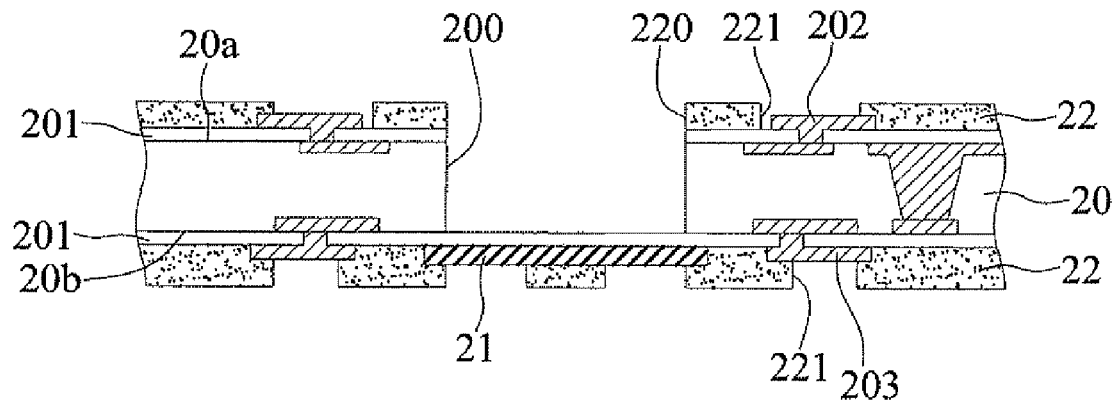
Figure 2E:
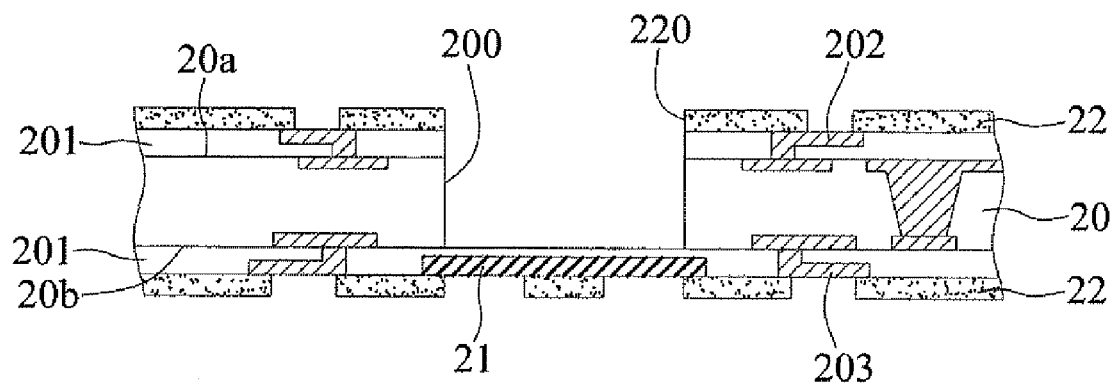

FIGS. 2D and 2E are cross-sectional schematic diagrams of a package substrate structure in accordance with another embodiment of the present invention. In this embodiment, the cavity 200 does not penetrate the dielectric layer 201 on the second surface 20b of the substrate 20, and the dielectric layer 201 on the second surface 20b of the substrate 20 covers one end of the cavity 200. Referring to FIG. 2D, the metal board 21 is disposed on the dielectric layer 201. Referring to FIG. 2D and FIG. 2E, alternatively, the metal board 21 is embedded, in whole (as shown in FIG. 2D) or in part, in the dielectric layer 201.

As the cavity 200 does not penetrate the dielectric layer 201 on the second surface 20b of the substrate 20, the metal board 21 is not exposed from the cavity 200, and the semiconductor chip 23 is fixed, via the inactive surface 23b thereof, in position to the dielectric layer 201 exposed from the cavity 200.

Figure 3:
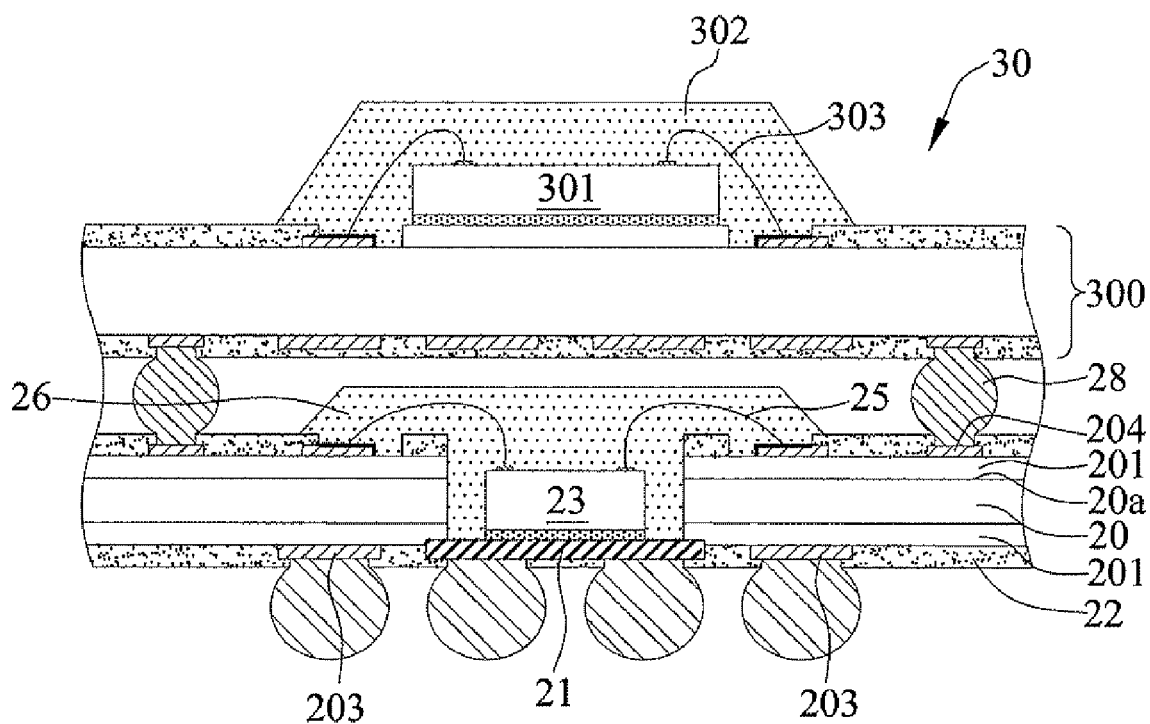
FIG. 3 is a cross-sectional schematic diagram showing a stacking structure of semiconductor packages in accordance with the present invention.

FIG. 3 is a cross-sectional schematic diagram showing a stacking structure of semiconductor packages in accordance with the present invention. As shown in the drawing, another package is stacked on the package structure of FIG. 2C to form a Package on Package (POP) structure. A plurality of conductive pads 204 are formed on the dielectric layer 201 on the first surface 20a of the substrate 20, and conductive elements 28 are mounted on the conductive pads 204, so as to provide support for and have electrical connection with at least a semiconductor package 30.

The semiconductor package 30 comprises a package substrate 300, a semiconductor chip 301 mounted on the package substrate 300 and electrically connected to the package substrate 300 by bonding wires 303, and an encapsulant 302 formed on a portion of the package substrate 300 and encapsulating the semiconductor chip 301, and bonding wires 303.

In other embodiments, the semiconductor package 30 substitutes for other types of semiconductor packages so as to further augment reduction in overall height thereof. It should be understood that, the semiconductor package 30 or other types of semiconductor packages, which can be mounted on the package structure in accordance with the present invention, are known in the art and are not limited to the features mentioned above, thereby not to be further detailed here.

Compared to the conventional technology, the foregoing package stacking structure advantageously has a greatly reduced overall height because of the use of the underlying/lowermost semiconductor package structure in accordance with the present invention. Owing to its compactness, the package stacking structure of the present invention promotes application of electronic devices.

In conclusion, the package substrate structure of the present invention comprises a substrate with a cavity for receiving a semiconductor chip such that the main structure height is exactly the height of the substrate regardless of the thickness of the semiconductor chip, and in consequence reduction of height can be effectively achieved. Moreover, the metal board of the package substrate structure is made of copper and is relatively thick so as to serve as a good carrier for the semiconductor chip by carrying the semiconductor chip firmly and removing heat from the semiconductor chip effectively.

The present invention has been described using exemplary preferred embodiments. However, it is to be understood that the scope of the present invention is not limited to the disclosed arrangements. The scope of the claims, therefore, should be accorded the broadest interpretation, so as to encompass all such modifications and equivalents.

What is claimed is:

1. A package substrate structure comprising:
    a substrate having a first surface and an opposing second surface and characterized by a plurality of wire-bonding pads provided on the first surface of the substrate, a plurality of ball-implanting pads provided on the second surface of the substrate, and at least a cavity formed to penetrate the first and second surfaces of the substrate;
    a metal board mounted on the second surface of the substrate and covering the cavity, wherein the metal board has a thickness greater than that of each of the ball-implanting pads and has an area greater than that of the cavity of the substrate; and
    solder masks disposed on the metal board and the first and second surfaces of the substrate respectively, and the solder masks on the first surface of the substrate having at least a solder-mask cavity corresponding in position to the cavity of the substrate, the solder masks on the first and second surfaces of the substrate further having a plurality of openings corresponding in position to and exposing the wire-bonding pads and the ball-implanting pads, wherein a part of a surface of the metal board is exposed from the openings of the solder masks on the second surface of the substrate.

2. The package substrate structure of claim 1, wherein the substrate is a two-layered or multi-layered package substrate completed with a predetermined circuit layout.

3. The package substrate structure of claim 1, further comprising a dielectric layer disposed between the second surface of the substrate and the solder mask on the second surface of the substrate, allowing the cavity of the substrate to penetrate the dielectric layer and the metal board to be provided on the dielectric layer.

4. The package substrate structure of claim 3, further comprising a semiconductor chip received in the cavity of the substrate and attached to the metal board, the semiconductor chip having an active surface provided with a plurality of electrode pads thereon and an opposing inactive surface attached to the metal board, wherein the wire-bonding pads of the substrate are electrically connected to the electrode pads of the semiconductor chip by bonding wires.

5. The package substrate structure of claim 1, further comprising a dielectric layer disposed between the second surface of the substrate and the solder mask on the second surface of the substrate, allowing the cavity of the substrate to penetrate the dielectric layer and the metal board to be at least partly embedded in the dielectric layer.

6. The package substrate structure of claim 5, further comprising a semiconductor chip received in the cavity of the substrate and attached to the metal board, the semiconductor chip having an active surface provided with a plurality of electrode pads thereon and an opposing inactive surface attached to the metal board, wherein the wire-bonding pads of the substrate are electrically connected to the electrode pads of the semiconductor chip by bonding wires.

7. The package substrate structure of claim 1, further comprising a dielectric layer disposed between the second surface of the substrate and the solder mask on the second surface of the substrate, configured to cover the cavity of the substrate, and positioned between the cavity of the substrate and the metal board, allowing the metal board to be provided on the dielectric layer.

8. The package substrate structure of claim 7, further comprising a semiconductor chip received in the cavity of the substrate and attached to the dielectric layer, the semiconductor chip having an active surface provided with a plurality of electrode pads thereon and an opposing inactive surface attached to the dielectric layer, wherein the wire-bonding pads of the substrate are electrically connected to the electrode pads of the semiconductor chip by bonding wires.

9. The package substrate structure of claim 1, further comprising a dielectric layer disposed between the second surface of the substrate and the solder mask on the second surface of the substrate, configured to cover the cavity of the substrate, and positioned between the cavity of the substrate and the metal board, allowing the metal board to be embedded in the dielectric layer.

10. The package substrate structure of claim 9, further comprising a semiconductor chip received in the cavity of the substrate and attached to the dielectric layer, the semiconductor chip having an active surface provided with a plurality of electrode pads thereon and an opposing inactive surface attached to the dielectric layer, wherein the wire-bonding pads of the substrate are electrically connected to the electrode pads of the semiconductor chip by bonding wires.

11. The package substrate structure of claim 1, further comprising a semiconductor chip received in the cavity of the substrate and attached to the metal board, the semiconductor chip having an active surface provided with a plurality of electrode pads thereon and an opposing inactive surface attached to the metal board, wherein the wire-bonding pads of the substrate are electrically connected to the electrode pads of the semiconductor chip by bonding wires.

12. The package substrate structure of claim 11, further comprising an encapsulant provided on the first surface of the substrate and configured to fill the cavity of the substrate, for encapsulating the semiconductor chip, the bonding wires and the wire-bonding pads.

13. The package substrate structure of claim 1, further comprising conductive pads provided on the first surface of the substrate.

14. The package substrate structure of claim 13, further comprising conductive elements disposed on the conductive pads, for being electrically connected to a semiconductor package.

15. The package substrate structure of claim 1, further comprising a surface treatment layer disposed on the wire-bonding pads of the substrate.

16. The package substrate structure of claim 1, wherein the metal board is made of copper.

17. The package substrate structure of claim 1, further comprising solder balls disposed in the openings of the solder mask on the second surface of the substrate and attached to the metal board and the ball-implanting pads, respectively.

18. The package substrate structure of claim 1, wherein the wire-bonding pads are coplanar with the first surface of the substrate and the ball-implanting pads are coplanar with the second surface of the substrate.

* * * * *